(12) United States Patent
Kanai et al.

(10) Patent No.: US 12,289,860 B2
(45) Date of Patent: Apr. 29, 2025

(54) LIQUID COOLING MODULE

(71) Applicant: Fujitsu Limited, Kawasaki (JP)

(72) Inventors: Yuki Kanai, Kawasaki (JP); Kenji Sasabe, Kawasaki (JP); Keita Hirai, Kawasaki (JP); Hideo Kubo, Kawasaki (JP); Atsushi Endo, Kawasaki (JP); Masahide Kodama, Kawasaki (JP); Takashi Urai, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 177 days.

(21) Appl. No.: 18/104,573

(22) Filed: Feb. 1, 2023

(65) Prior Publication Data

US 2023/0320029 A1 Oct. 5, 2023

(30) Foreign Application Priority Data

Apr. 4, 2022 (JP) ................................ 2022-062552

(51) Int. Cl.
*H05K 7/20* (2006.01)
*G06F 1/20* (2006.01)

(52) U.S. Cl.
CPC ........... *H05K 7/20263* (2013.01); *G06F 1/20* (2013.01); *H05K 7/20136* (2013.01)

(58) Field of Classification Search
CPC ........... H05K 7/20263; H05K 7/20136; H05K 7/20254; H05K 7/20636; G06F 1/20
See application file for complete search history.

(56) References Cited

U.S. PATENT DOCUMENTS

| 4,977,444 | A | | 12/1990 | Nakajima et al. | |
|---|---|---|---|---|---|
| 5,016,090 | A | * | 5/1991 | Galyon | H01L 23/4336 257/714 |
| 5,239,200 | A | * | 8/1993 | Messina | H01L 23/473 361/689 |
| 2005/0241804 | A1 | * | 11/2005 | Lee | H01L 23/473 257/E23.098 |
| 2006/0225867 | A1 | * | 10/2006 | Park | F28F 9/0263 165/170 |
| 2020/0227341 | A1 | * | 7/2020 | Neal | F28F 3/12 |

FOREIGN PATENT DOCUMENTS

| JP | 1-111362 A | 4/1989 |
|---|---|---|
| JP | 2006-73881 A | 3/2006 |

* cited by examiner

*Primary Examiner* — Jacob R Crum
(74) *Attorney, Agent, or Firm* — WHDA, LLP

(57) ABSTRACT

A liquid cooling module includes a heat-receiver, an inlet-passage in which a flow-path through which the liquid-refrigerant flowed from an inlet flows is formed, a first flow-passage in which the flow-path continues from the inlet-passage, and that is formed as spreading in a fan-like shape as viewed in a normal-direction of a heat-receiving-surface, a second flow-passage in which the flow-path continues from the first flow-passage, and that is formed toward the heat-receiver in the normal-direction, a diffuser in which grooves that continue from the second flow-passage in the heat-receiver and diffuses the liquid-refrigerant along a surface on an opposite side of the heat-receiving-surface is formed, a third flow-passage in which the flow-path continues from the grooves, and that is formed in the normal-direction and a direction in which the flow-path is separating from the heat-receiver, and an outlet-passage in which the flow-path continues from the third flow-passage to an outlet.

10 Claims, 6 Drawing Sheets

LIQUID COOLING MODULE

CROSS-REFERENCE TO RELATED APPLICATION

This application is based upon and claims the benefit of priority of the prior Japanese Patent Application No. 2022-62552, filed on Apr. 4, 2022, the entire contents of which are incorporated herein by reference.

FIELD

The technology disclosed in the present application is related to a liquid cooling module.

BACKGROUND

There is a structure in which a cooling block is arranged on a back surface side of a heat element chip, cools the heat element chip, and keeps a semiconductor element temperature in the chip at a fixed temperature. In this structure, a part of a flow quantity of refrigerant liquid flowing in a main flow passage pipe is branched with a refrigerant liquid branching mechanism having a pipe structure and is guided to the side of the heat element chip of the cooling block. In a surface on a side of the cooling block that has contact with the heat element chip, cooling fins are arranged in parallel or radially, and the refrigerant liquid flows between the fins. At this time, the refrigerant liquid removes heat generated in the heat element chip via phosphorus and is heated.

Furthermore, there is a structure in which a semiconductor element such as a central processing unit (CPU) and a cooling plate are configured to be in close thermal contact with each other, partition plates form a flow passage in the cooling plate in a state where the partition plates on both ends are provided on one side of the pipe side and remaining partition plates are arranged in a staggered manner. In this structure, a suction pipe and a discharge pipe are disposed on one side of the cooling plate, a space for the pipes is not needed on the front and rear sides of the cooling plate due to high-density mounting components, and the pipes can be compactly accommodated.

Japanese Laid-open Patent Publication No. 1-111362 and Japanese Laid-open Patent Publication No. 2006-73881 are disclosed as related art.

SUMMARY

According to an aspect of the embodiments, a liquid cooling module includes a heat receiver that includes a heat receiving surface that receives heat of a cooling target, an inlet passage that includes an inlet into which a liquid refrigerant that exchanges heat in the heat receiver flows, and in which a flow path through which the liquid refrigerant flowed from the inlet flows is formed, a first flow passage in which the flow path continues from the inlet passage, and that is formed as spreading in a fan-like shape as viewed in a normal direction of the heat receiving surface, a second flow passage in which the flow path continues from the first flow passage, and that is formed toward the heat receiver in the normal direction, a diffuser in which a plurality of grooves that continues from the flow path of the second flow passage in the heat receiver and diffuses the liquid refrigerant along a surface on an opposite side of the heat receiving surface is formed, a third flow passage in which the flow path continues from the plurality of grooves, and that is formed in the normal direction and a direction in which the flow path is separating from the heat receiver, and an outlet passage that includes an outlet that flows out the liquid refrigerant, and in which the flow path continues from the third flow passage to the outlet, wherein the flow path at the inlet passage and the flow path at the outlet passage are at same height positions from the heat receiving surface.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

A liquid cooling module cools an electronic component that is a cooling target through heat transfer to a liquid refrigerant. In an electronic device including such a liquid cooling module therein, there is a case where a height is limited. For example, as the liquid cooling module, it is required to secure a cooling performance and reduce the height.

Hereinafter, embodiments of technologies capable to secure the cooling performance of the liquid cooling module and reduce the height will be described in detail with reference to the drawings.

EMBODIMENTS

Figure 1:
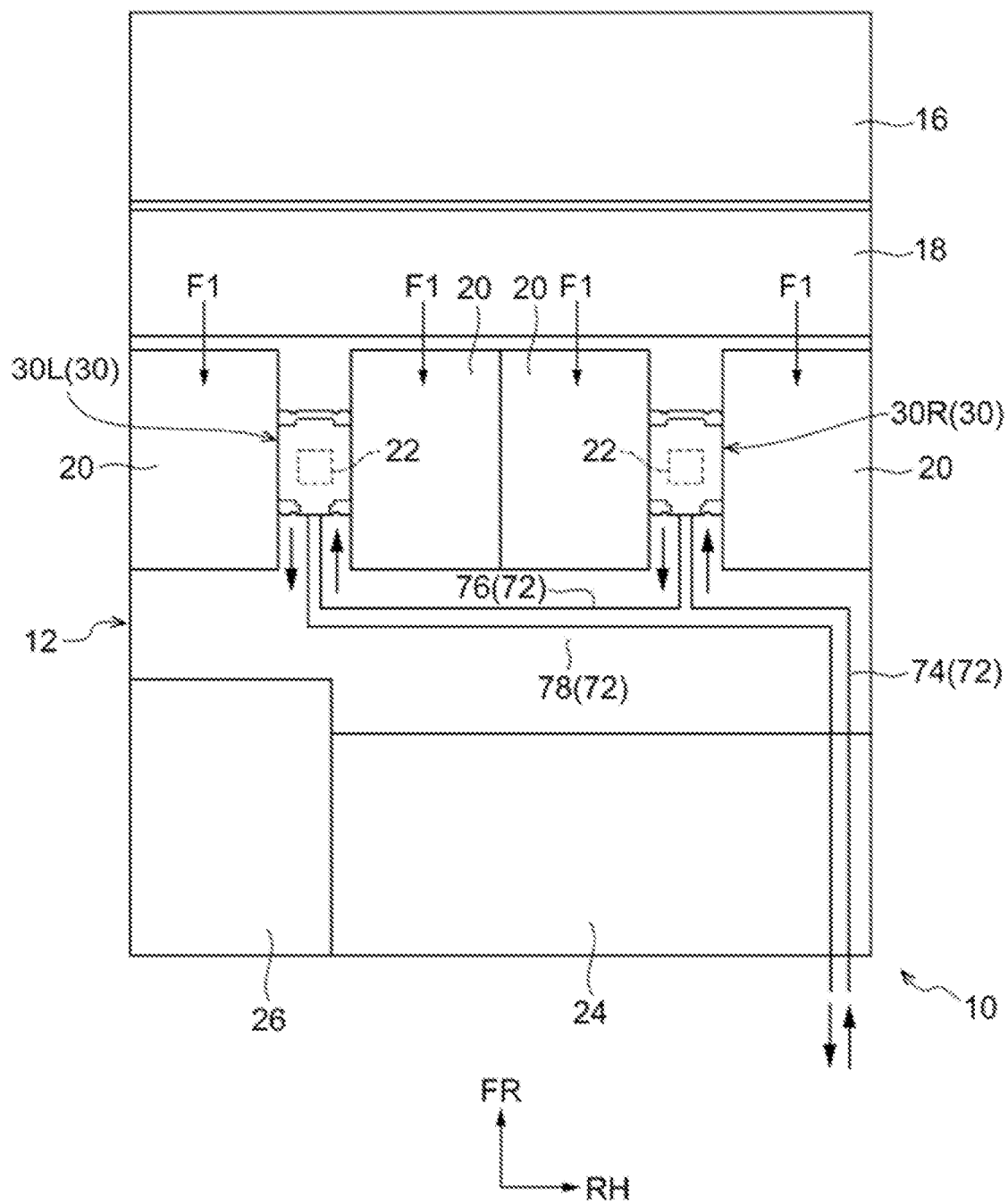
FIG. 1 is a plan view of an electronic device including a liquid cooling module according to one embodiment of the technology disclosed in the present application.

In FIG. 1, an electronic device 10 including a liquid cooling module 30 according to one embodiment of the technology disclosed in the present application is illustrated in planar view. The electronic device 10 includes a housing 12 as illustrated in FIG. 1. The housing 12 is a rectangular box-like member, as an example. The front side in the front-back direction of the electronic device 10 is indicated by an arrow FR, the right side in the width direction is indicated by an arrow RH, and the upper side in the height direction is indicated by an arrow UP. The electronic device 10 is, for example, a server, and for example, a rack mount server. The rack mount server is mounted on a rack in a posture in which a height direction of the rack mount server is the vertical direction.

An auxiliary storage device such as a hard disk drive (HDD) 16 is mounted on the front side in the housing 12. A fan 18 is mounted on the rear side of the HDD 16. Moreover, on the rear side of the fan 18, a main storage device such as a dual inline memory module (DIMM) 20 and a processor (processing device) such as a central processing unit (CPU) 22 are arranged side by side in the width direction. The CPU 22 and the DIMM 20 are mounted on a board 14 (refer to FIGS. 5 and 6) or the like.

In the example illustrated in FIG. 1, the number of CPUs 22 is two. The two corresponding DIMMs 20 are arranged on each of both sides in the width direction for each CPU 22. Each CPU 22 and the corresponding DIMMs 20 on the both sides are electrically connected, for example, with a wiring pattern or the like on the board 14 and exchange electrical signals.

The CPU 22 is an example of a "cooling target" according to the technology of the present disclosure. Using the CPU 22 as a reference, the fan 18 is positioned on the front side of the CPU 22, and the DIMMs 20 are positioned on both of the left and right sides in the width direction.

By driving the fan 18, wind in a direction indicated by an arrow F1 in FIG. 1, for example, an airflow is generated. This wind cools the DIMM 20. The DIMM 20 is an example of a "second cooling target" according to the technology of the present disclosure.

A connection device such as a peripheral component interconnect (PCI) 24 and a power supply device such as a power supply unit (PSU) 26 are mounted on the rear side in the housing 12.

The liquid cooling module 30 illustrated in FIGS. 2 to 6 is provided corresponding to each CPU 22 and cools the CPU 22 by receiving heat of the CPU 22. In the present embodiment, since the number of CPUs 22 is two, the two liquid cooling modules 30 are provided. Hereinafter, in a case where the two liquid cooling modules 30 are distinguished from each other, the two liquid cooling modules 30 are distinguished as a liquid cooling module 30L on the left side in the width direction and a liquid cooling module 30R on the right side in the width direction. In either of the two liquid cooling modules 30, the CPU 22 overlaps at the center position of the liquid cooling module 30 in planar view, for example, as viewed in the normal direction of a heat receiving surface 48 to be described later. In the present embodiment, the normal direction of the heat receiving surface 48 is also the height direction of the liquid cooling module 30.

In the present embodiment, the front-back direction, the width direction, and the depth direction of the liquid cooling module 30 respectively match the front-back direction, the width direction, and the depth direction of the electronic device 10. Therefore, the arrow FR, the arrow RH, and the arrow UP in FIGS. 2 to 6 respectively indicate the front side in the front-back direction, the right side in the width direction, and the upper side in the vertical direction of the liquid cooling module 30.

Figure 2:
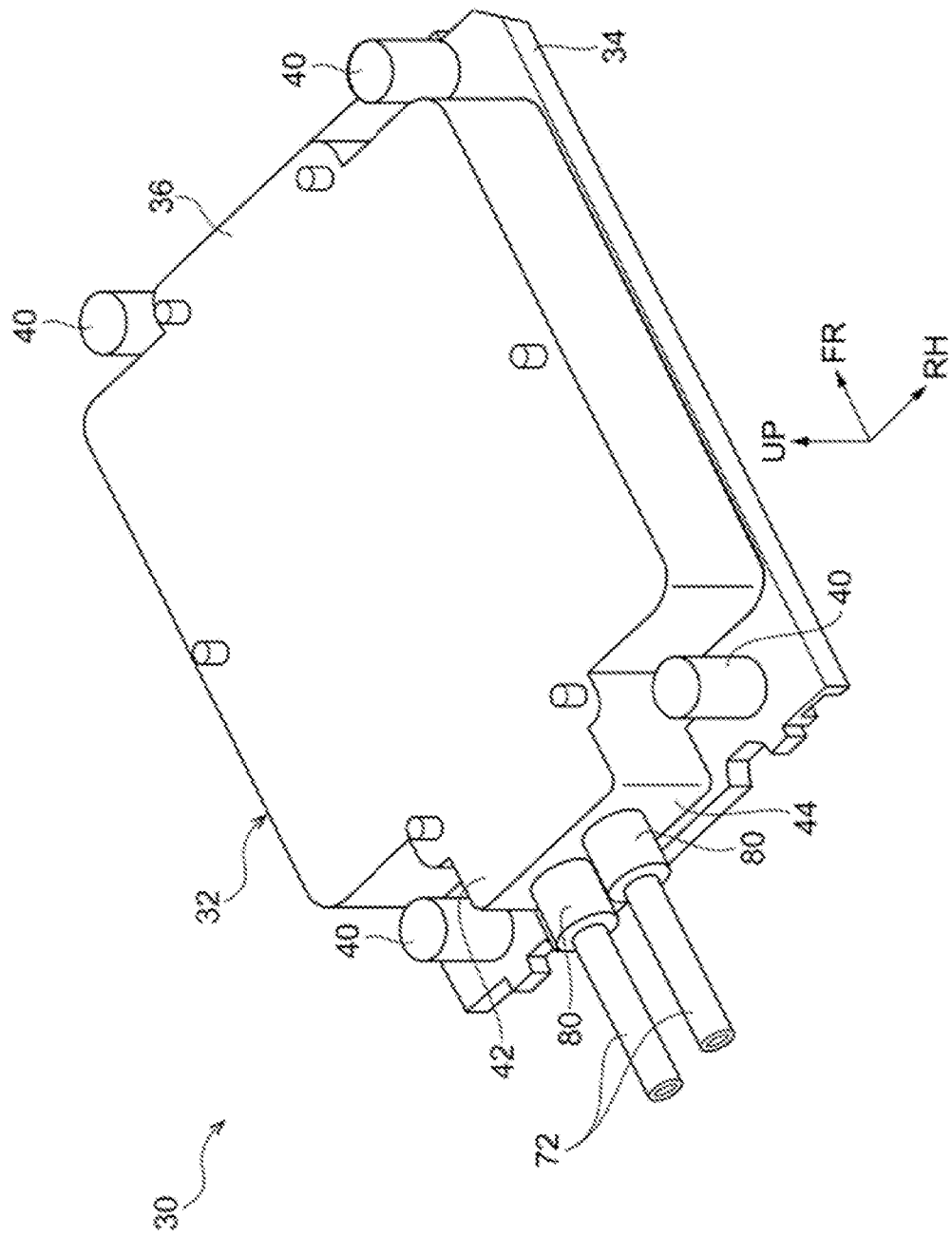
FIG. 2 is a perspective view illustrating the liquid cooling module according to one embodiment of the technology disclosed in the present application.
Figure 3:
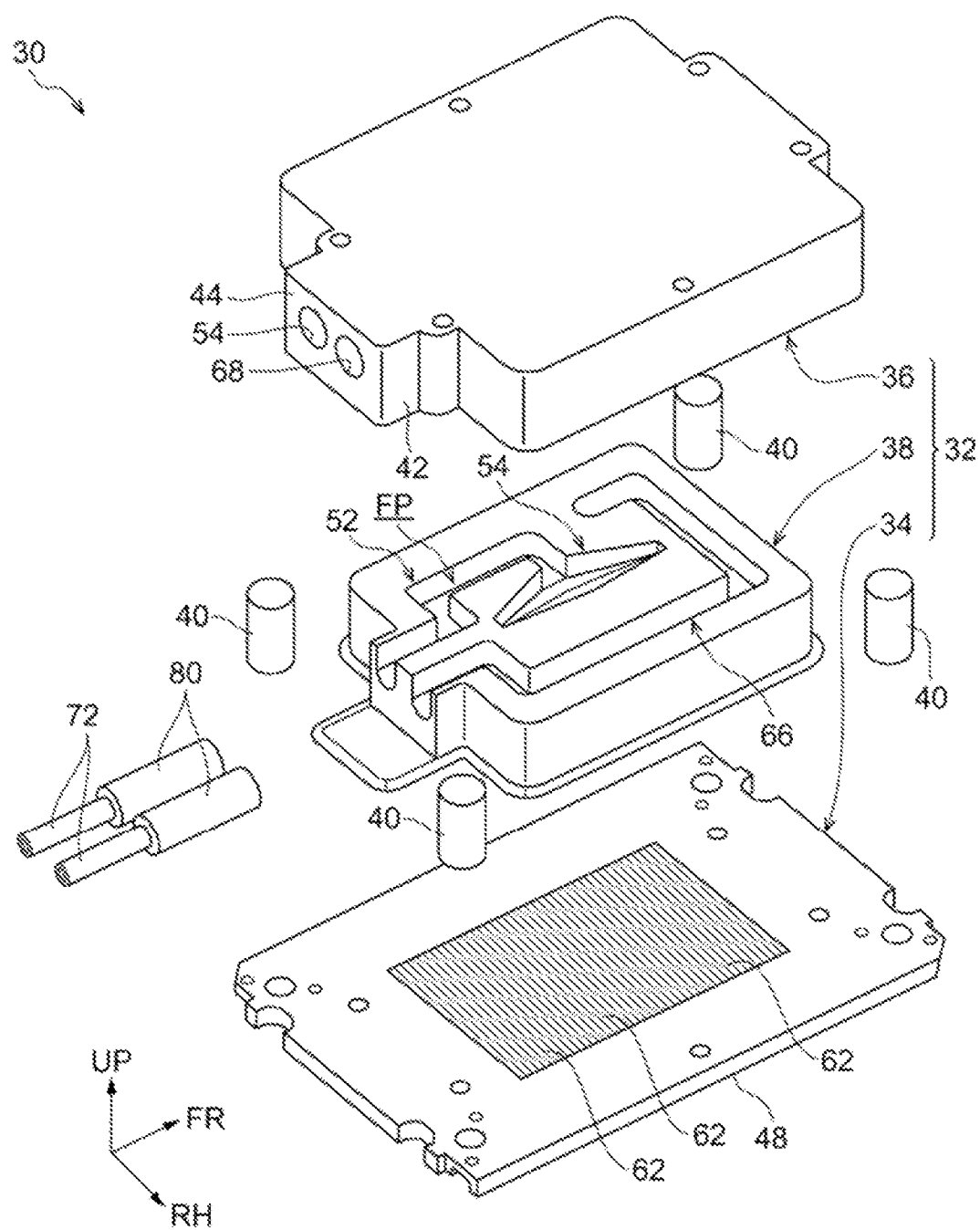
FIG. 3 is an exploded perspective view illustrating the liquid cooling module according to one embodiment of the technology disclosed in the present application.

As illustrated in FIGS. 2 and 3, the liquid cooling module 30 includes a cold plate 32. As illustrated in FIG. 3, the cold plate 32 includes a base 34, a cover 36, and a flow passage block 38.

The base 34 is a plate-like member, and for example, at each of four corners, the base 34 is fixed to the board 14 or the like with a fastener 40.

The flow passage block 38 is a member on which recesses and holes forming a flow path FP having a predetermined shape as described later and is mounted on the base 34.

The cover 36 is a box-like member of which a lower surface side opens. The cover 36 is fixed to the base 34 in a state of covering a top surface, a right side surface, a left side surface, a front surface, and a rear surface of the flow passage block 38 mounted on the base 34. In a portion of the flow passage block 38 where a recess portion is formed, the recess portion forms the flow path FP by covering the flow passage block 38 with the cover 36 in this way. Note that the flow passage block 38 and the cover 36 have shapes that do not interfere with the fasteners 40.

On the rear side of the cold plate 32, a convex portion 42 projected backward in a convex manner is formed at the center in the width direction. A rear surface of the convex portion 42 is an opening surface 44. In the opening surface 44, an inlet 54 and an outlet 68 are opened as described later.

Figure 5:
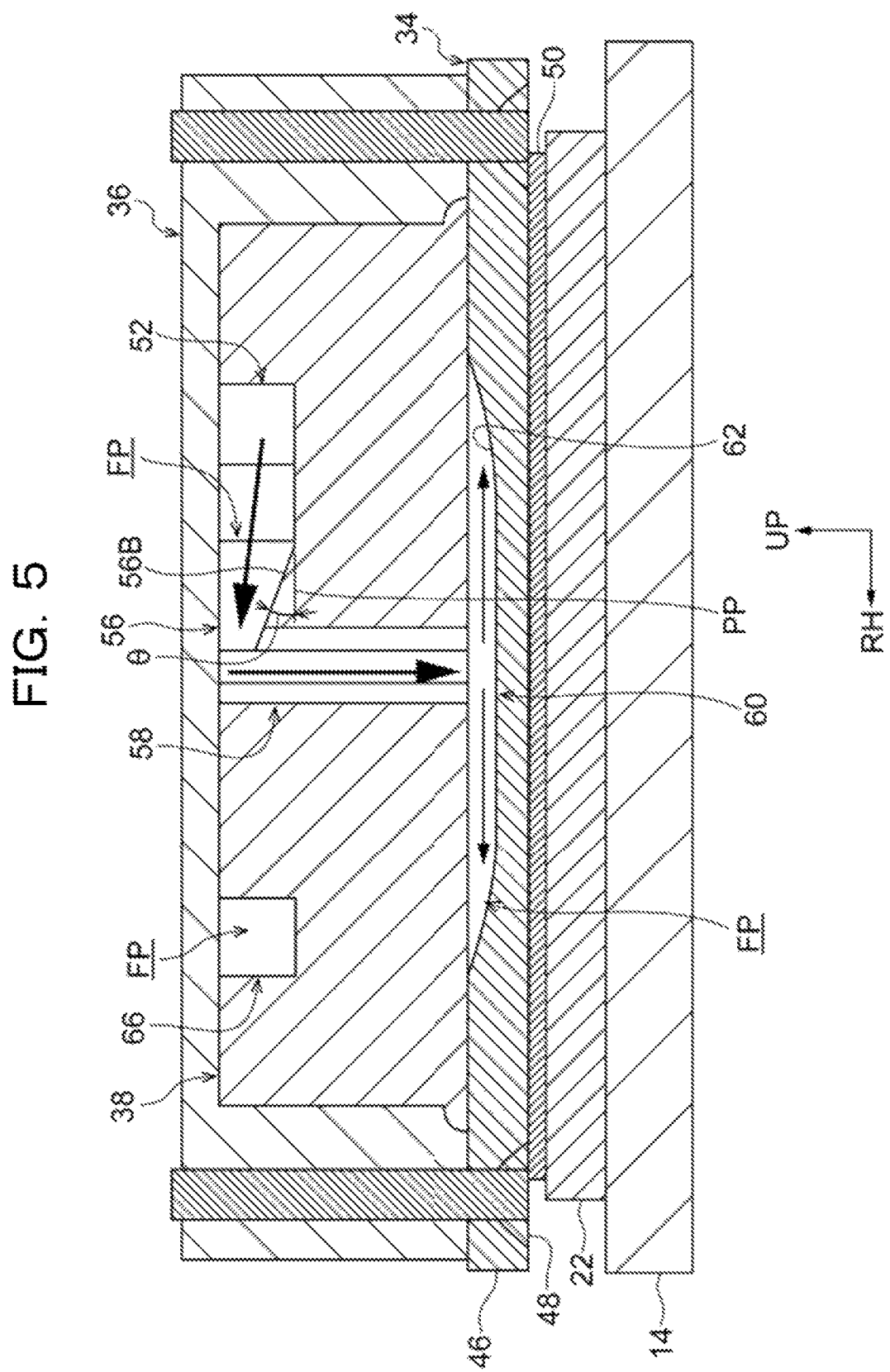
FIG. 5 is a cross-sectional view taken along a line 5-5 in FIG. 4 illustrating the liquid cooling module according to one embodiment of the technology disclosed in the present application.
Figure 6:
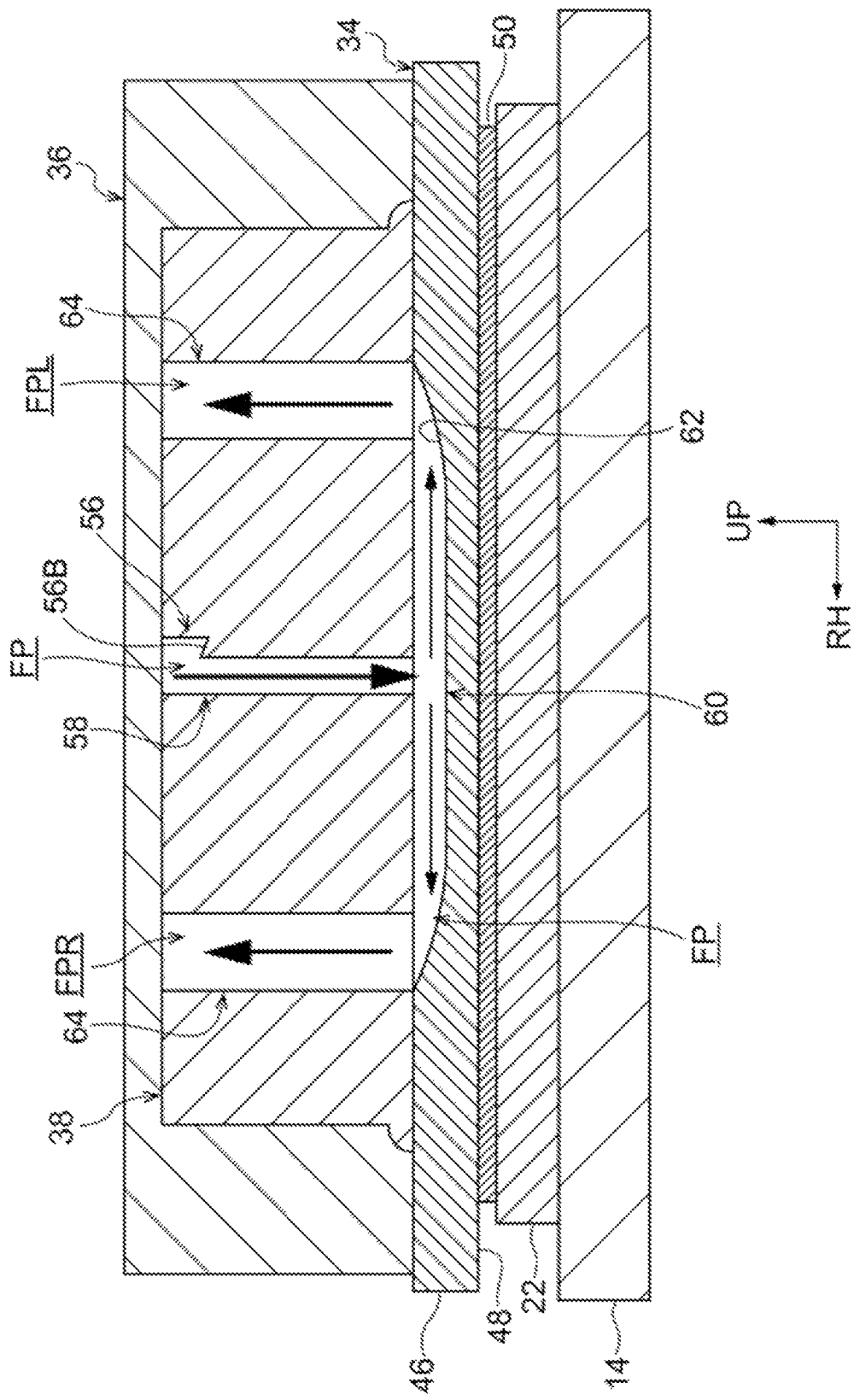
FIG. 6 is a cross-sectional view taken along a line 6-6 in FIG. 4 illustrating the liquid cooling module according to one embodiment of the technology disclosed in the present application.

As illustrated in FIGS. 5 and 6, a lower portion of the liquid cooling module 30 is a heat receiving portion 46. The heat receiving portion 46 includes the heat receiving surface 48 on the lower surface of the base 34. The heat receiving surface 48 is arranged on the top surface of the CPU 22 via a heat transfer member 50 such as a heat transfer sheet or a grease. The heat receiving surface 48 is a surface that receives heat of the CPU 22.

The liquid cooling module 30 includes an inlet portion (inlet passage) 52, a first flow passage portion 56, a second flow passage portion 58, a diffusion portion 60, a third flow passage portion 64, and an outlet portion (outlet passage) 66 in the cold plate 32. Then, in the liquid cooling module 30, the flow path FP is formed in which a liquid cooling refrigerant flows in order of the inlet portion 52, the first flow passage portion 56, the second flow passage portion 58, the diffusion portion 60, the third flow passage portion 64, and the outlet portion 66.

The inlet portion 52 and the outlet portion 66 are positioned on the upper portion of the cold plate 32, in the cold plate 32.

The inlet portion 52 includes the opening inlet 54 on the opening surface 44. A pipe 72 is connected to the inlet 54 via a connector 80. As illustrated in FIG. 3, the inlet 54 is continuous with the flow path FP at the inlet portion 52 of the flow passage block 38.

Figure 4:
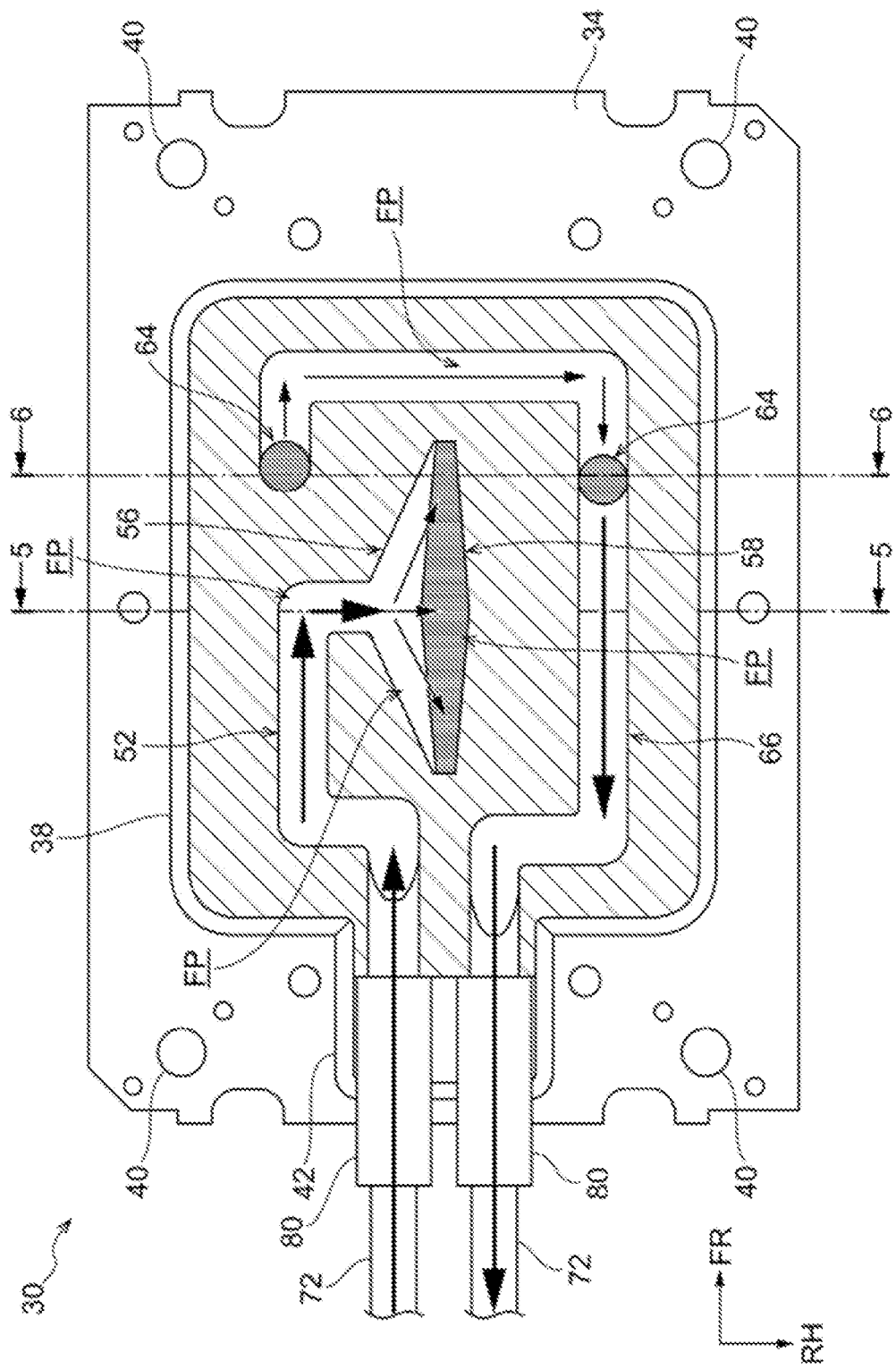
FIG. 4 is a plan cross-sectional view illustrating the liquid cooling module according to one embodiment of the technology disclosed in the present application.

As illustrated in FIGS. 3 and 4, the flow path FP at the inlet portion 52 has a shape that extends forward from the inlet 54, curves leftward in the width direction in the middle, and curves forward, and in addition, curves rightward in the width direction. Then, the flow path FP at the inlet portion 52 is parallel to the heat receiving surface 48 (refer to FIG. 5) over the entire length.

As illustrated in FIGS. 3 to 5, the flow path FP at the first flow passage portion 56 is continuous with the flow path FP at the inlet portion 52. The flow path FP at the first flow passage portion 56 has a shape that spreads out in a fan-like shape from the front end of the flow path FP on the side of the inlet portion 52, in planar view, for example, as viewed in the normal direction of the heat receiving surface 48.

This "fan-like shape" indicates a shape that spreads leftward and rightward with respect to the center on the downstream side in the flow of the refrigerant flowed from the flow path FP at the inlet portion 52. In the example illustrated in FIG. 4, the flow path FP at the first flow passage portion 56 has a shape that spreads in the front-back direction from the left side in the width direction toward the right side in the width direction. This flow path FP having the fan-like shape is positioned at the center in the front-back direction and the center in the width direction of the liquid cooling module 30, in planar view.

Furthermore, as illustrated in FIG. 5, a bottom surface 56B of the flow path FP at the first flow passage portion 56 is inclined toward a direction away from the heat receiving surface 48, for example, upward, from the left side in the width direction toward the right side in the width direction. An inclination angle θ at which the bottom surface 56B of the flow path FP at the first flow passage portion 56 is inclined is fixed at any position in the flow path FP at the first flow passage portion 56. This inclination angle θ is an angle of the bottom surface 56B of the flow path FP with respect to a surface PP parallel to the heat receiving surface 48. Furthermore, the bottom surface 56B of the flow path FP at the first flow passage portion 56 is not inclined in the direction in which the fan-like shape spreads, for example, the front-back direction of the liquid cooling module 30.

A length of an inclined portion of the bottom surface 56B of the flow path FP at the first flow passage portion 56 is longer at the center of the fan-like shape and is shorter on both sides of the fan-like shape (both sides in front-back direction of liquid cooling module 30). For example, when the flow path FP at the first flow passage portion 56 in the cross section illustrated in FIG. 5 is compared with the flow path FP at the first flow passage portion 56 in the cross section illustrated in FIG. 6, the flow path FP illustrated in FIG. 5 is longer.

From the front end portion of the flow path FP at the first flow passage portion 56, the flow path FP at the second flow passage portion 58 continues. The flow path FP at the second flow passage portion 58 is formed toward the heat receiving portion 46, for example, downward.

As illustrated in FIG. 4, the flow path FP at the second flow passage portion 58 has an opening length same as the flow path FP at the first flow passage portion 56, in the front-back direction of the liquid cooling module 30. On the other hand, in the width direction of the liquid cooling module 30, the flow path FP has an opening width shorter than, for example, an inner diameter of the flow path FP of the inlet portion 52 (opening length in width direction of liquid cooling module 30). Then, the opening width of the flow path FP at the second flow passage portion 58 is gradually narrowed from the center toward both ends in the front-back direction.

The diffusion portion 60 is provided in the heat receiving portion 46. On the top surface of the base 34, for example, a surface on the opposite side of the heat receiving surface, a plurality of grooves 62 continuous from the flow path FP at the second flow passage portion 58 is formed. The flow path FP at the diffusion portion 60 has a microchannel structure that diffuses the refrigerant with the plurality of grooves 62 in this way. For example, each of the plurality of grooves 62 extends in the width direction of the cold plate 32, and these plurality of grooves 62 spreads the liquid refrigerant in the width direction. Furthermore, the plurality of grooves 62 is formed at regular intervals (pitch) in the front-back direction of the cold plate 32. A portion where the groove 62 is formed is in a range same as the flow path FP at the second flow passage portion 58, in the front-back direction of the cold plate 32. As a result, the refrigerant that flows through the flow path FP at the second flow passage portion 58 flows into any one of the plurality of grooves 62 and is diffused in the width direction. The interior of the groove 62 also form a part of the flow path FP of the refrigerant.

A cross-sectional area of the flow path FP for all of the plurality of grooves 62 is set, for example, to be smaller than the flow path FP at the inlet portion 52 and further to be smaller than a cross-sectional area of the flow path FP at the second flow passage portion 58. Therefore, for example, as compared with a structure of which the cross-sectional area of the flow path FP for all of the plurality of grooves 62 is larger than the cross-sectional area of the flow path FP at the second flow passage portion 58, a flow velocity of the refrigerant flowing through the groove 62 increases.

From the diffusion portion 60, the flow path FP at the third flow passage portion 64 continues. The flow path FP at the third flow passage portion 64 is formed in a direction in which the flow path FP is separating from the heat receiving portion 46, for example, upward.

In the present embodiment, a plurality of the flow passages FP at the third flow passage portion 64 is provided. In the example illustrated in FIG. 6, the two flow passages FP at the third flow passage portion 64 are provided with an interval in the width direction. Hereinafter, the flow passages FP at the third flow passage portion 64 are appropriately distinguished from each other as a flow path FPR that is a flow passage on the right side in the width direction and a flow path FPL that is a flow passage on the left side in the width direction. The flow path FPR on the right side in the width direction is formed upward from a position at an end of the groove 62 on the right side in the width direction, and the flow path FPL on the left side in the width direction is formed upward from a position at an end of the groove 62 on the left side in the width direction.

The flow path FP at the outlet portion 66 is continuous from the flow path FPR on the right side in the width direction of the third flow passage portion 64. For example, the flow path FP at the outlet portion 66 is formed forward from the flow path FPR, further formed to be curved rightward in the width direction, and further to be curved rearward. Then, to the middle of the portion formed rearward in this way, the flow path FPR on the left side in the width direction of the third flow passage portion 64 joins.

The flow path FP at the outlet portion 66 is curved leftward in the width direction and is curved rearward again, from the portion formed rearward. The flow path FP at the outlet portion 66 is parallel to the heat receiving surface 48 over the entire length.

As illustrated in FIG. 3, the outlet portion 66 includes the opening outlet 68 on the opening surface 44. The outlet 68 is continuous with the flow path FP at the outlet portion 66 of the flow passage block 38. The pipe 72 is connected to the outlet 68 via the connector 80, similarly to the inlet 54. The pipe 72 connected to the inlet 54 and the pipe 72 connected to the outlet 68 are parallel to each other at a connected portion to the inlet 54 and a connected portion to the outlet 68.

As illustrated in FIG. 3, a height position from the heat receiving surface 48, for example, a position in the vertical direction of the liquid cooling module 30 of the flow path FP at the outlet portion 66 is the same height position as the flow path FP at the inlet portion 52 over the entire length. The height position from the heat receiving surface 48 is also a position in the normal direction of the heat receiving surface 48.

Here, the fact that the heights from the heat receiving surface 48 are the "same" indicates that the flow path FP at the inlet portion 52 and the flow path FP at the outlet portion 66 partially or entirely overlap in the height direction when viewing the liquid cooling module 30 in the width direction. For example, in the example illustrated in FIG. 5, the flow path FP at the inlet portion 52 and the flow path FP at the outlet portion 66 have the same cross-sectional shape, and the center of the opening portion of the inlet portion 52 and the center of the opening portion of the outlet portion 66 are at the same height. Then, when viewed in the width direction, the flow path FP at the inlet portion 52 and the flow path FP at the outlet portion 66 entirely overlap in the height direction.

Furthermore, the flow path FP at the inlet portion 52 and the flow path FP at the outlet portion 66 have the same height from the heat receiving surface 48, with respect to the flow path FP at the first flow passage portion 56. Then, as illustrated in FIG. 4, the flow path FP at the inlet portion 52 and the flow path FP at the outlet portion 66 are arranged at positions avoiding the flow path FP at the first flow passage portion 56, in planar view. For example, the flow path FP at the first flow passage portion 56 is arranged at the center of the liquid cooling module 30, whereas the flow path FP at the inlet portion 52 and the flow path FP at the outlet portion 66 are arranged along an outer periphery of the liquid cooling module 30. A part of the flow path FP at the inlet portion 52 and a part of the flow path FP at the outlet portion 66 surround the flow path FP at the first flow passage portion 56 (fan-like shape flow path FP), in planar view.

In the entire liquid cooling module 30, the flow path FP of the refrigerant is folded from the front side toward the rear side in the liquid cooling module 30 between a position where the refrigerant is introduced from the inlet 54 and a position where the refrigerant is discharged from the outlet 68. Then, both of the inlet 54 and the outlet 68 are formed on the opening surface 44.

In this way, the flow path FP in the cold plate 32 has a portion that is formed in all of the depth direction, the width direction, and the height direction and has a three-dimensional structure.

As illustrated in FIG. 3, the inlet 54 and the outlet 68 open into the opening surface 44 of the liquid cooling module 30. Furthermore, the inlet 54 and the outlet 68 have the same height positions from the heat receiving surface 48.

As illustrated in FIG. 1, the pipe 72 connected to the inlet 54 of the liquid cooling module 30R on the right side in the width direction acts as an introduction pipe 74. The refrigerant is introduced from outside of the electronic device 10 into the liquid cooling module 30R through the introduction pipe 74.

The pipe 72 connected to the outlet 68 of the liquid cooling module 30L acts as a discharge pipe 78. The liquid refrigerant in the liquid cooling module 30L is discharged to the outside of the electronic device 10 through the discharge pipe 78.

The pipe 72 connects between the outlet 68 of the liquid cooling module 30R on the right side in the width direction and the inlet 54 of the liquid cooling module 30L, and this pipe 72 acts as a transfer pipe 76. The liquid refrigerant is discharged from the outlet 68 of the liquid cooling module 30R through the transfer pipe 76, sent to the inlet 54 of the liquid cooling module 30L, and introduced into the liquid cooling module 30L. The transfer pipe 76 functions as a discharge pipe for the liquid cooling module 30R and functions as an introduction pipe for the liquid cooling module 30L.

Both of the liquid cooling module 30R and the liquid cooling module 30L are arranged in a direction in which the opening surface 44 faces rearward. All of the introduction pipe 74, the transfer pipe 76, and the discharge pipe 78 are arranged on the rear side without passing through the front side of the liquid cooling module 30R and the liquid cooling module 30L. For example, the introduction pipe 74, the transfer pipe 76, and the discharge pipe 78 are arranged to avoid a range between the fan 18 and the DIMM 20.

Next, actions of the present embodiment will be described.

A liquid refrigerant is introduced into the liquid cooling module 30, from the inlet 54. This refrigerant flows from the flow path FP at the inlet portion 52 toward the flow path FP at the first flow passage portion 56, in the liquid cooling module 30. The flow path FP at the first flow passage portion 56 has a fan-like shape, and the refrigerant spreads in the front-back direction along the shape of the flow path FP at the first flow passage portion 56. Moreover, the refrigerant flows through the flow path FP at the second flow passage portion 58. Since the flow path FP at the second flow passage portion 58 extends toward the heat receiving surface 48, the refrigerant flows toward the heat receiving surface 48.

Moreover, the refrigerant flows through the flow path FP at the diffusion portion 60. Since the flow path FP at the diffusion portion 60 has the plurality of grooves 62, the refrigerant flows into any one of the plurality of grooves 62 and flows as spreading in the width direction. Therefore, the refrigerant is diffused in the front-back direction and the width direction, in the diffusion portion 60. Since the diffusion portion 60 is provided in the heat receiving portion 46, the heat of the CPU 22 is transferred to the refrigerant via the heat receiving portion 46, and the CPU 22 is cooled.

Then, the refrigerant flows in a direction away from the heat receiving portion 46, through the flow path FP at the third flow passage portion 64. Moreover, the refrigerant flows through the flow path FP at the outlet portion 66 and is discharged to the outside of the liquid cooling module 30 from the outlet 68.

In this way, the refrigerant is diffused in the front-back direction and the width direction, in the heat receiving portion 46 of the liquid cooling module 30. Therefore, as compared with a structure in which the refrigerant is not diffused, it is possible to more efficiently receive the heat of the CPU 22 by the refrigerant. For example, as compared with a cooling device that cools the CPU 22 using cooling wind, that is, a so-called air-cooling cooling device, in the present embodiment, it is possible to efficiently cool the cooling target through liquid-cooling.

In the present embodiment, the flow path FP of the refrigerant is folded after the refrigerant is diffused with the flow path FP at the diffusion portion 60, in the liquid cooling module 30. For example, although a direction in which the refrigerant flows from the inlet 54 on the rear surface is a front side, the flow path FP has a structure that is folded rearward in the liquid cooling module 30 and in which the refrigerant flows out from the outlet 68 on the rear surface side. By folding the flow path FP in this way, a structure is realized in which the inlet 54 and the outlet 68 can be formed on the same surface, for example, the opening surface 44.

The flow path FP at the inlet portion 52 and the flow path FP at the outlet portion 66 have the same height position from the heat receiving surface 48. On the other hand, in a structure in which the flow path FP at the inlet portion 52 and the flow path FP at the outlet portion 66 have different height positions from the heat receiving surface 48, a height occupied by the flow path FP when viewing the liquid cooling module 30 in the width direction increases. In the present embodiment, since the height occupied by the flow passages FP at the inlet portion 52 and the outlet portion 66 is low as viewed in the width direction, a height dimension of the liquid cooling module 30 can be reduced.

For example, in the present embodiment, the flow path FP at the inlet portion 52 and the flow path FP at the outlet portion 66 entirely overlap in the height direction, as viewing the liquid cooling module 30 in the width direction.

Therefore, as compared with a structure in which the flow path FP at the inlet portion 52 and the flow path FP at the outlet portion 66 partially overlap in the height direction, the height dimension of the liquid cooling module 30 can be further reduced.

Note that, the fact that the flow path FP at the inlet portion 52 and the flow path FP at the outlet portion 66 have the same height position from the heat receiving surface 48 can be visually recognized as that the height positions of the inlet 54 and the outlet 68 are the same, as an appearance of the liquid cooling module 30.

In a server or the like that is an example of the electronic device 10 including the liquid cooling module 30, the height of the housing 12 may be set to be a height determined according to standards. For example, in the rack mount server mounted on the rack, the height of the housing 12 may be within a range of 1 U using 1 U=44.45 mm as a unit. In this case, it is difficult to arrange the liquid cooling module, of which the height dimension is large, in the housing 12 having the height of 1 U. For example, in an electronic device having a structure in which various components and members are densely mounted in the housing 12, it is difficult to secure a space where the liquid cooling module is mounted, in the housing 12.

On the other hand, the liquid cooling module 30 according to the present embodiment can be arranged in the housing 12, for example, having the height dimension of 1 U, by reducing the height dimension. For example, it is possible to obtain the electronic device 10 in which the housing 12 with the low height dimension can implement a structure in which the CPU 22 that is the cooling target can be efficiently cooled through liquid cooling.

In the present embodiment, both of the flow path FP at the inlet portion 52 and the flow path FP at the outlet portion 66 are parallel to the heat receiving surface 48. On the other hand, for example, in a structure in which the flow path FP at the inlet portion 52 is inclined with respect to the heat receiving surface 48, the height of the liquid cooling module increases due to the inclination of the flow path FP. Similarly, even in a structure in which the flow path FP at the outlet portion 66 is inclined with respect to the heat receiving surface 48, the height of the liquid cooling module increases due to the inclination of the flow path FP. In the present embodiment, since the flow path FP at the inlet portion 52 and the flow path FP at the outlet portion 66 are parallel to the heat receiving surface 48, the height dimension of the liquid cooling module 30 does not increase due to the inclination of the flow path FP, and it is possible to reduce the height dimension of the liquid cooling module 30.

Since the flow path FP at the first flow passage portion 56 spreads in the fan-like shape, the refrigerant spreads and flows in this spreading direction, and retention of the refrigerant is prevented. Furthermore, the flow path FP at the first flow passage portion 56 is inclined in a direction gradually separating from the heat receiving surface 48 as spreading in the fan-like shape, for example, upward. Due to this inclination, a resistance acts on a flow of the refrigerant that is flowing through the flow path FP at the first flow passage portion 56. Then, the length of the inclined portion of the flow path FP at the first flow passage portion 56 is longer at the center of the fan-like shape, and is shorter on both sides of the fan-like shape (both sides in front-back direction of liquid cooling module 30). Therefore, the resistance with respect to the flow of the refrigerant is large at the center of the fan-like shape and is small on both sides of the fan-like shape. At the center of the fan-like shape, since the refrigerant flows straight from the flow path FP at the inlet portion 52, a flow velocity at an initial stage of the flow increases. On the other hand, on both sides of the fan-like shape, the flow velocity at the initial stage of the flow relatively decreases. However, since the inclined portion at the center of the fan-like shape is long, the resistance of the flow more largely acts than that on both sides. As a result, in the entire flow path FP at the first flow passage portion 56, the flow velocity of the refrigerant is equalized. If the flow velocity of the refrigerant is locally different, a possibility that a retention or vortex of the flow occurs increases. However, in the present embodiment, it is possible to prevent the occurrence of the retention and the vortex of the refrigerant flowing through the flow path FP at the first flow passage portion 56.

The flow path FP at the second flow passage portion 58 is formed toward the center of the heat receiving surface 48. Since the center of the heat receiving surface 48 is a position where the CPU 22 that is an example of the cooling target is in contact, the heat of the CPU 22 can be efficiently transferred to the refrigerant flowing through the flow path FP.

The number of flow passages FP at the third flow passage portion 64 in the present embodiment is plural (two). As compared with a structure having one flow path FP at the third flow passage portion 64, the refrigerant flowing through the flow path FP at the diffusion portion 60 can be efficiently moved to the flow path FP at the outlet portion 66.

For example, in the present embodiment, the two flow passages FP at the third flow passage portion 64 are the flow path FPR on the right side in the width direction and the flow path FPL on the left side in the width direction. Therefore, in the diffusion portion 60, the refrigerant diffused in the width direction can be moved from both of the right side in the width direction and the left side in the width direction to the flow path FP at the outlet portion 66.

In the present embodiment, as illustrated in FIG. 5, the height position of the flow path FP at the first flow passage portion 56 is the same as the height positions of the flow path FP at the inlet portion 52 and the flow path FP at the outlet portion 66. Therefore, as compared with a structure in which the height position of the flow path FP at the first flow passage portion 56 is different from the height positions of the flow path FP at the inlet portion 52 and the flow path FP at the outlet portion 66, the height dimension of the liquid cooling module 30 can be reduced.

Furthermore, the flow path FP at the inlet portion 52 and the flow path FP at the outlet portion 66 are arranged along the outer periphery of the liquid cooling module 30, in planar view. As a result, a structure can be realized in which the flow path FP at the first flow passage portion 56 can be arranged at the center of the liquid cooling module 30 in planar view.

The electronic device 10 according to the present embodiment includes the fan 18, as illustrated in FIG. 1. Wind generated by the fan 18 can cool the DIMM 20.

The introduction pipe 74, the transfer pipe 76, and the discharge pipe 78 are arranged to avoid a range between the fan 18 and the DIMM 20. Since the introduction pipe 74, the transfer pipe 76, and the discharge pipe 78 do not exist between the fan 18 and the DIMM 20, it is possible to arrange the fan 18 and the DIMM 20 to be close to each other, and the DIMM 20 can be efficiently cooled with wind of the fan 18. Furthermore, by arranging the fan 18 and the DIMM 20 to be close to each other, various members and components can be densely arranged in the housing 12.

Furthermore, the transfer pipe 76 is a pipe through which the refrigerant is discharged from the liquid cooling module 30R, and this refrigerant often has a higher temperature than the refrigerant introduced into the liquid cooling module 30R. Furthermore, the discharge pipe 78 is a pipe through which the refrigerant is discharged from the liquid cooling module 30L, and this refrigerant often has a higher temperature than the refrigerant introduced into the liquid cooling module 30R and the refrigerant introduced into the liquid cooling module 30L. In the present embodiment, since the wind generated by the fan 18 does not pass through the transfer pipe 76 and the discharge pipe 78 in which such a high-temperature refrigerant flows, an increase in the temperature of the wind can be suppressed, and the DIMM 20 can be efficiently cooled.

For example, in the present embodiment, the two liquid cooling modules 30R and 30L, in which the inlet 54 and the outlet 68 open into the same opening surface 44, are included. Then, the two liquid cooling modules 30R and 30L are arranged so that the both of the opening surfaces 44 face the same direction (rearward in example in FIG. 1). Therefore, a structure can be easily realized in which the outlet 68 of the liquid cooling module 30R and the inlet 54 of the liquid cooling module 30L are connected with the transfer pipe 76 on the side where the opening surface 44 is formed.

While one embodiment of the technology disclosed in the present application has been described thus far, the technology disclosed in the present application is not limited to the above and, in addition to the above, various modifications can be made without departing the spirit of the embodiment.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A liquid cooling module comprising:
a heat receiver that includes a heat receiving surface that receives heat of a cooling target;
an inlet passage that includes an inlet into which a liquid refrigerant that exchanges heat in the heat receiver flows, and in which a flow path through which the liquid refrigerant flowed from the inlet flows is formed;
a first flow passage in which the flow path continues from the inlet passage, and that is formed as spreading in a fan-like shape as viewed in a normal direction of the heat receiving surface;
a second flow passage in which the flow path continues from the first flow passage, and that is formed toward the heat receiver in the normal direction;
a diffuser in which a plurality of grooves that continues from the flow path of the second flow passage in the heat receiver and diffuses the liquid refrigerant along a surface on an opposite side of the heat receiving surface is formed;
a third flow passage in which the flow path continues from the plurality of grooves, and that is formed in the normal direction and a direction in which the flow path is separating from the heat receiver; and
an outlet passage that includes an outlet that flows out the liquid refrigerant, and in which the flow path continues from the third flow passage to the outlet,
wherein the flow path at the inlet passage and the flow path at the outlet passage are at same height positions from the heat receiving surface.

2. The liquid cooling module according to claim 1, wherein the inlet and the outlet open into a same opening surface.

3. The liquid cooling module according to claim 1, wherein the flow path of the liquid refrigerant at the inlet passage and the flow path of the liquid refrigerant at the outlet passage are parallel to the heat receiving surface.

4. The liquid cooling module according to claim 1, wherein a bottom surface of the first flow passage is inclined to a direction in which the bottom surface is gradually separating from the heat receiving surface as spreading in the fan-like shape.

5. The liquid cooling module according to claim 1, wherein the flow path at the second flow passage is formed toward a center of the heat receiving surface.

6. The liquid cooling module according to claim 1, wherein the third flow passage includes a plurality of the flow paths.

7. The liquid cooling module according to claim 1, wherein a height position of the flow path at the first flow passage from the heat receiving surface is the same as height positions of the flow path at the inlet passage and the flow path at the outlet passage.

8. An electronic device comprising:
a liquid cooling module that includes
a heat receiver that includes a heat receiving surface that receives heat of a cooling target,
an inlet passage that includes an inlet into which a liquid refrigerant that exchanges heat in the heat receiving portion flows, and in which a flow path through which the liquid refrigerant flowed from the inlet flows is formed,
a first flow passage in which the flow path continues from the inlet passage, and that is formed as spreading in a fan-like shape as viewed in a normal direction of the heat receiving surface,
a second flow passage in which the flow path continues from the first flow passage, and that is formed toward the heat receiving portion,
a diffuser in which a plurality of grooves that continues from the flow path of the second flow passage in the heat receiver and diffuses the liquid refrigerant along a surface on an opposite side of the heat receiving surface is formed,
a third flow passage in which the flow path continues from the plurality of grooves, and that is formed in a direction in which the flow path is separating from the heat receiver, and
an outlet passage that includes an outlet that flows out the liquid refrigerant, and in which the flow path continues from the third flow passage to the outlet, and
wherein the flow path at the inlet passage and the flow path at the outlet passage are at same height positions from the heat receiving surface; and
an electronic component as the cooling target to be arranged in contact with the heat receiving surface.

9. The electronic device according to claim 8, further comprising:
a fan configured to generate wind that cools a second cooling target; and
a pipe arranged to avoid a range between the fan and the second cooling target and configured to discharge the liquid refrigerant from the outlet.

10. The electronic device according to claim 8,
wherein the electronic device includes a plurality of the liquid cooling modules, each including the inlet and the outlet that open into a same opening surface, and
wherein the plurality of liquid cooling modules is arranged with the opening surfaces that face the same direction.

\* \* \* \* \*